(12) United States Patent
Zhao et al.

(10) Patent No.: US 12,364,147 B2
(45) Date of Patent: Jul. 15, 2025

(54) DISPLAY SUBSTRATE AND METHOD FOR MANUFACTURING THE SAME, AND DISPLAY DEVICE

(71) Applicants: Chengdu BOE Optoelectronics Technology Co., Ltd., Sichuan (CN); BOE Technology Group Co., Ltd., Beijing (CN)

(72) Inventors: Pan Zhao, Beijing (CN); Zhiliang Jiang, Beijing (CN); Ge Wang, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 35 days.

(21) Appl. No.: 18/307,083

(22) Filed: Apr. 26, 2023

(65) Prior Publication Data
US 2023/0263015 A1  Aug. 17, 2023

Related U.S. Application Data

(63) Continuation of application No. 17/253,271, filed as application No. PCT/CN2020/092535 on May 27, 2020, now Pat. No. 11,678,524.

(30) Foreign Application Priority Data

Jun. 3, 2019  (CN) .......................... 201910478176.0

(51) Int. Cl.
*H10K 59/122* (2023.01)
*H10K 59/80* (2023.01)
*H10K 71/00* (2023.01)

(52) U.S. Cl.
CPC ....... *H10K 59/8731* (2023.02); *H10K 59/122* (2023.02); *H10K 71/00* (2023.02)

(58) Field of Classification Search
CPC ........................... H10K 59/122; H10K 71/00
(Continued)

(56) References Cited

U.S. PATENT DOCUMENTS 9,905,629 B2  2/2018  Kim et al.
9,905,801 B2  2/2018  Kim
(Continued)

FOREIGN PATENT DOCUMENTS

CN  106098724 A  11/2016
CN  106158881 A  11/2016
(Continued)

OTHER PUBLICATIONS

U.S. Office Action dated Aug. 19, 2022, issued in U.S. Appl. No. 17/253,271.
(Continued)

*Primary Examiner* — Dzung Tran
(74) *Attorney, Agent, or Firm* — WHDA, LLP

(57) ABSTRACT

A display substrate, a method for manufacturing a display substrate, and a display device are provided. The display substrate includes an effective display area, a punch area, and a critical area between the effective display area and the punch area. The critical area of the display substrate includes: a substrate, and at least one first barrier wall on the substrate. The at least one first barrier wall is a convex structure.

8 Claims, 4 Drawing Sheets

(58) Field of Classification Search
USPC .......................................................... 257/40
See application file for complete search history.

(56) References Cited

U.S. PATENT DOCUMENTS

| | | |
|---|---|---|
| 9,991,465 B2 | 6/2018 | Jeon |
| 10,490,773 B2 | 11/2019 | Kim |
| 2015/0036299 A1 | 2/2015 | Namkung et al. |
| 2015/0041772 A1* | 2/2015 | Han .................... H10K 59/122 438/23 |
| 2016/0233248 A1 | 8/2016 | Kwak et al. |
| 2016/0315284 A1 | 10/2016 | Jeon |
| 2016/0336541 A1 | 11/2016 | Kim |
| 2017/0148856 A1* | 5/2017 | Choi .................... H10K 59/873 |
| 2017/0288004 A1 | 10/2017 | Kim et al. |
| 2018/0097199 A1 | 4/2018 | Jo et al. |
| 2018/0102502 A1 | 4/2018 | Kim et al. |
| 2018/0138451 A1 | 5/2018 | Kim |
| 2018/0287093 A1 | 10/2018 | Lee et al. |
| 2020/0066813 A1 | 2/2020 | Zhao et al. |
| 2020/0280021 A1 | 9/2020 | Li et al. |
| 2021/0167149 A1 | 6/2021 | Zhao et al. |

FOREIGN PATENT DOCUMENTS

| | | |
|---|---|---|
| CN | 107275363 A | 10/2017 |
| CN | 108511503 A | 9/2018 |
| CN | 109616506 A | 4/2019 |
| CN | 110164945 A | 8/2019 |
| JP | 2009-70737 A | 4/2009 |

OTHER PUBLICATIONS

U.S. Office Action dated Nov. 2, 2022, issued in U.S. Appl. No. 17/253,271.

U.S. Notice of Allowance dated Feb. 13, 2023, issued in U.S. Appl. No. 17/253,271.

* cited by examiner

DISPLAY SUBSTRATE AND METHOD FOR MANUFACTURING THE SAME, AND DISPLAY DEVICE

CROSS-REFERENCE TO RELATED APPLICATION

This application is a Continuation of U.S. patent application Ser. No. 17/253,271, filed on Dec. 17, 2020, which is a U.S. National Stage entry of International Application No. PCT/CN2020/092535, filed on May 27, 2020, and claims priority to Chinese Patent Application No. 201910478176.0, filed with China National Intellectual Property Administration, on Jun. 3, 2019, which is incorporated herein by reference in its entirety.

TECHNICAL FIELD

The present disclosure relates to a field of display technology, and in particular to a display substrate, a method for manufacturing a display substrate, and a display device.

BACKGROUND

As a mobile phone market favors full-screen mobile phones, a product with a hole punched in a display area and a camera placed in the punch area is born. However, there are many difficulties in a technology of punching a hole in the display area. For example, cracks are likely to occur when the display area is cut, and in subsequent processes, the crack is easy to extend to an effective display area, resulting in an encapsulation failure and reducing reliability of a display product.

SUMMARY

According to an aspect of the present disclosure, there is provided a display substrate, including an effective display area, a punch area, and a critical area between the effective display area and the punch area. The critical area of the display substrate includes: a substrate, and at least one first barrier wall on the substrate, wherein the at least one first barrier wall is a convex structure.

In some embodiments, the at least one first barrier wall comprises a first gate metal layer, a first gate insulating layer, a second gate metal layer, a second gate insulating layer, and a source and drain metal layer stacked in sequence, and the first gate metal layer is closer to the substrate than the first gate insulating layer.

In some embodiments, a thin film transistor in the effective display area is of a top gate type, the first gate metal layer, the first gate insulating layer, the second gate metal layer, the second gate insulating layer, and the source and drain metal layer of the at least one first barrier wall are in same layers and made of same materials as a first gate metal layer, a first gate insulating layer, a second gate metal layer, a second gate insulating layer, and a source and drain metal layer of the effective display area, respectively, wherein the thin film transistor includes the first gate metal layer, the first gate insulating layer, and the source and drain metal layer of the effective display area.

In some embodiments, the substrate includes: a base substrate; and an inorganic film layer on the base substrate.

In some embodiments, a portion of the inorganic film layer close to the punch area has a thickness less than a thickness of the other portion of the inorganic film layer.

In some embodiments, the critical area of the display substrate further includes: a second barrier wall on the substrate and between the first barrier wall and the effective display area, wherein the second barrier wall includes a planarization layer, a first pixel defining layer, and a first supporting layer arranged in a stack, the planarization layer is closer to the substrate than the first pixel defining layer, and the second barrier wall has a height greater than a height of the first barrier wall.

In some embodiments, the planarization layer, the first pixel defining layer, and the first supporting layer of the second barrier wall are in same layers and made of same materials as a planarization layer, a pixel defining portion, and a supporting portion of a display element in the effective display area, respectively.

In some embodiments, the critical area of the display substrate further includes: a third barrier wall on the substrate and between the second barrier wall and the effective display area, wherein the third barrier wall includes a second pixel defining layer and a second supporting layer arranged in a stack, the second pixel defining layer is closer to the substrate than the second supporting layer, and the third barrier wall has a height greater than the height of the first barrier wall and less than or equal to the height of the second barrier wall.

In some embodiments, the second pixel defining layer and the second supporting layer of the third barrier wall are in same layers and made of same materials as the pixel defining portion and the supporting portion of the display element in the effective display area, respectively.

In some embodiments, the second pixel defining layer and the second supporting layer of the third barrier wall are made of same material, and the first pixel defining layer and the first supporting layer of the second barrier wall are made of same material.

In some embodiments, the source and drain metal layer comprises a first titanium material layer, an aluminum material layer, and a second titanium material layer arranged in a stack, and edges of the aluminum material layer are indented relative to edges of the first titanium material layer and the second titanium material layer.

In some embodiments, the critical area of the display substrate further includes: a first functional layer on the substrate and the first barrier wall, wherein the first functional layer is disconnected by the source and drain metal layer.

In some embodiments, the first functional layer is an organic light-emitting layer.

In some embodiments, the first barrier wall includes metal layers and insulating layers arranged in a stack.

According to another aspect of the present disclosure, there is provided a method for manufacturing a display substrate, wherein the display substrate includes an effective display area, a punch area, and a critical area between the effective display area and the punch area, the method including: providing a substrate; and forming at least one first barrier wall on the substrate, at a position corresponding to the critical area, wherein the at least one first barrier wall is a convex structure.

In some embodiments, the forming at least one first barrier wall on the substrate includes: forming a first gate metal layer, a first gate insulating layer, a second gate metal layer, a second gate insulating layer, and a source and drain metal layer in sequence on the substrate, to obtain the at least one first barrier wall.

In some embodiments, the providing a substrate includes: providing a base substrate; forming an inorganic film material layer on the base substrate; etching the inorganic film material layer to obtain an inorganic film layer.

In some embodiments, the method further includes: forming a planarization layer, a first pixel defining layer, and a first supporting layer in sequence between the first barrier wall and the effective display area on the substrate, to obtain a second barrier wall, wherein the second barrier wall has a height greater than a height of the first barrier wall.

In some embodiments, the method further includes: forming a second pixel defining layer and a second supporting layer in sequence between the second barrier wall and the effective display area on the substrate, to obtain a third barrier wall, wherein the third barrier wall has a height greater than the height of the first barrier wall and less than or equal to the height of the second barrier wall.

In some embodiments, the method further includes: forming a first functional layer on the substrate and the first barrier wall, wherein the first functional layer is disconnected by the source and drain metal layer.

According to yet another aspect of the present disclosure, there is provided a display device including the above-mentioned display substrate.

BRIEF DESCRIPTION OF THE DRAWINGS

In order to more clearly explain the technical solutions in the embodiments of the present disclosure, the drawings required in the description of the embodiments will be briefly introduced below. Obviously, the drawings in the following description are only some embodiments of the present disclosure. For those ordinary skilled in the art, other drawings may be obtained based on these drawings without paying any creative work.

DETAILED DESCRIPTION OF EMBODIMENTS

In order to make the above objectives, features and advantages of the present disclosure more obvious and understandable, the present disclosure will be further described in detail below with reference to the drawings and specific embodiments.

The inventors have found that, a crack formed in a cutting process for punching a hole in a display area is related to a thickness of an inorganic layer at a cutting edge. In a process of depositing a film layer, CVD (Chemical Vapor Deposition) Mask and other masks may not support and shield a punch area. Therefore, an inorganic film layer deposited by CVD may extend from an effective display area to a cutting edge of a hole. As a result, a thickness of the inorganic film layer at the cutting edge increases, which leads to generate cracks in the cutting process, and in subsequent processes, the cracks further extends to the effective display area, resulting in an encapsulation failure.

Figure 1:
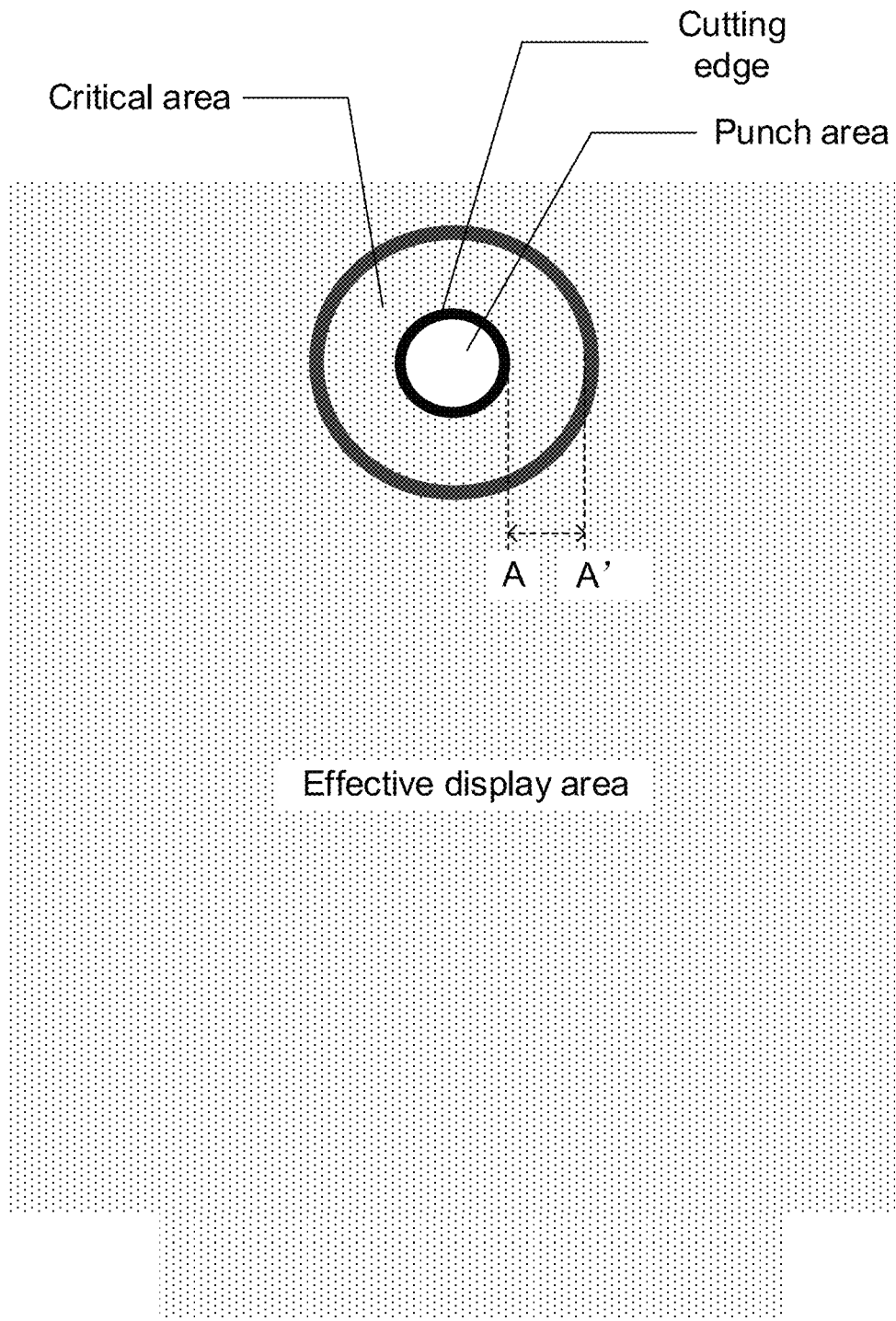
FIG. 1 shows a schematic diagram of a plane structure of a display substrate provided by an embodiment of the present disclosure.
Figure 2:
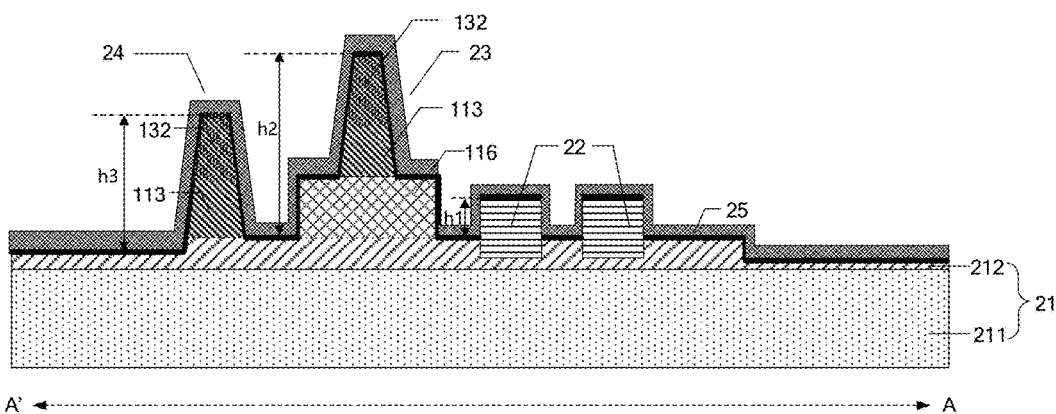
FIG. 2 shows a schematic diagram of a cross-sectional structure of a display substrate at AA' position of FIG. 1 provided by an embodiment of the present disclosure.

To solve the above problems, an embodiment of the present disclosure provides a display substrate. With reference to FIG. 1, the display substrate includes an effective display area, a punch area, and a critical area arranged between the effective display area and the punch area. With reference to FIG. 2, the critical area of the display substrate includes: a substrate 21; and at least one first barrier wall 22 arranged on the substrate 21. For example, as shown in FIG. 2, the critical area may include two first barrier walls spaced apart from each other, and a recess portion is formed between the two first barrier walls. The at least one first barrier wall 22 includes metal layers and insulating layers arranged in a stack. The first barrier wall 22 is a convex structure.

The substrate 21 includes a base substrate 211, and the base substrate 211 may be a flexible base substrate and may specifically include a first organic layer PI1, a first inorganic layer Barrier1, and a second organic layer PI2 arranged in a stack. In practice, the substrate 21 may further include an inorganic material layer formed on the base substrate 211, and the inorganic material layer may specifically include a second inorganic layer barrier2, an interlayer dielectric layer ILD, a gate insulating layer GI, and a buffer layer buffer. The second inorganic layer barrier2 is disposed close to the second organic layer PI2.

Since the first barrier wall 22 protrudes from the substrate 21, a plurality of first barrier walls 22 arranged independently on the substrate 21 form a plurality of undulations, and the plurality of undulations may block a propagation of a crack generated in a process of cutting to form the punch area. On the one hand, the crack formed in the cutting process propagates to the undulations, and if the crack continue to propagate, the direction of propagation needs to be changed and a large amount of energy is required, thereby achieving an effect of blocking the propagation of the crack; on the other hand, these undulations increase propagation paths of the crack, thereby preventing the crack from propagating to the effective display area.

Figure 6A:
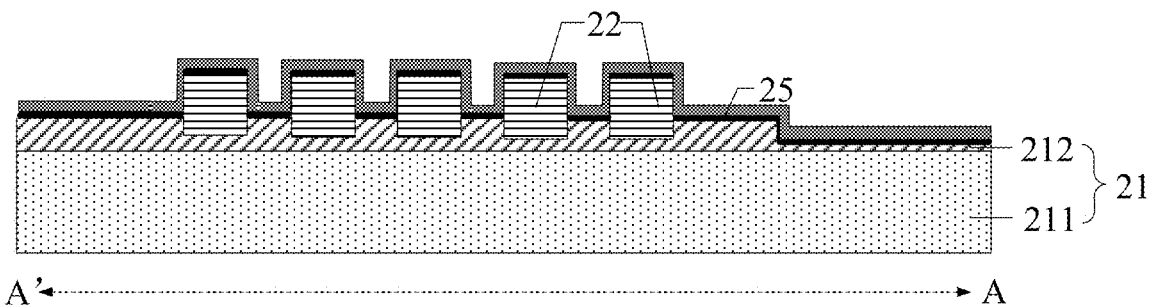
FIGS. 6A to 6C show schematic diagrams of partial cross-sectional structures of display substrates including a plurality of first barrier walls at AA' position of FIG. 1 provided by an embodiment of the present disclosure.
Figure 6B:
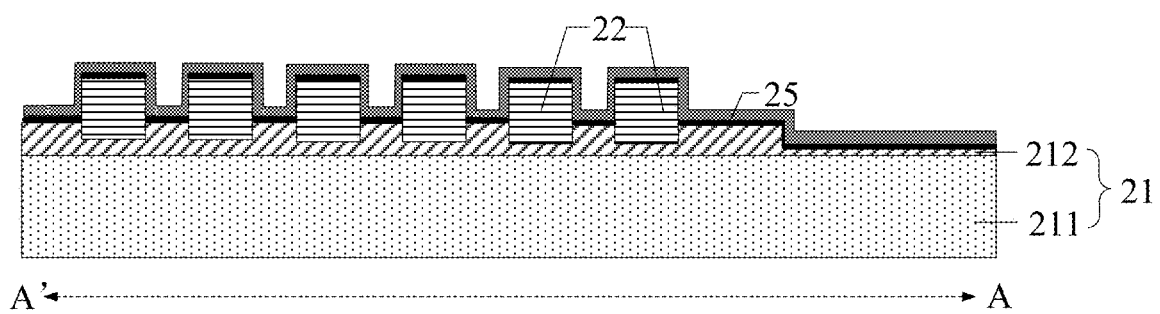
Figure 6C:
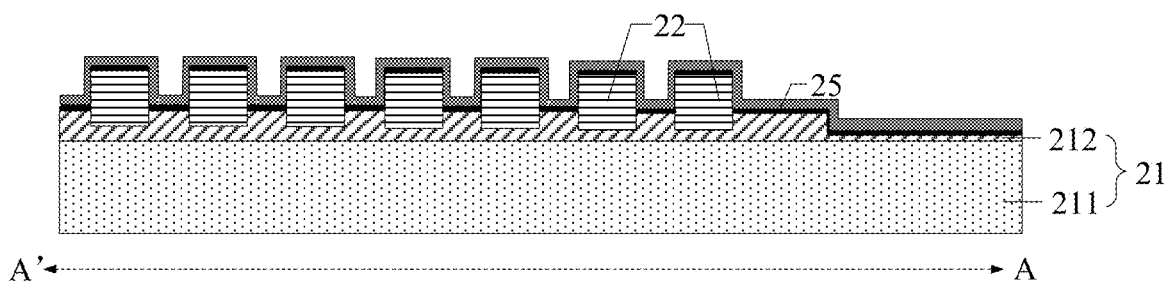

The number of the first barrier walls 22 may be determined according to actual needs. For example, 5 to 7 first barrier walls 22 may be provided on the substrate 21. As shown in FIG. 6A, five first barrier walls 22 are provided on the substrate 21. As shown in FIG. 6B, six first barrier walls 22 are provided on the substrate 21. As shown in FIG. 6C, seven first barrier walls 22 are provided on the substrate 21. This embodiment does not limit the number of the first barrier walls 22.

In the display substrate provided by this embodiment, by providing the first barrier walls protruding from a surface of the substrate in the critical area, the undulations formed by the first barrier walls on the surface of the substrate may block the propagation of the crack and block an extension of the crack to the effective display area, thereby improving reliability of the display product.

Figure 3:
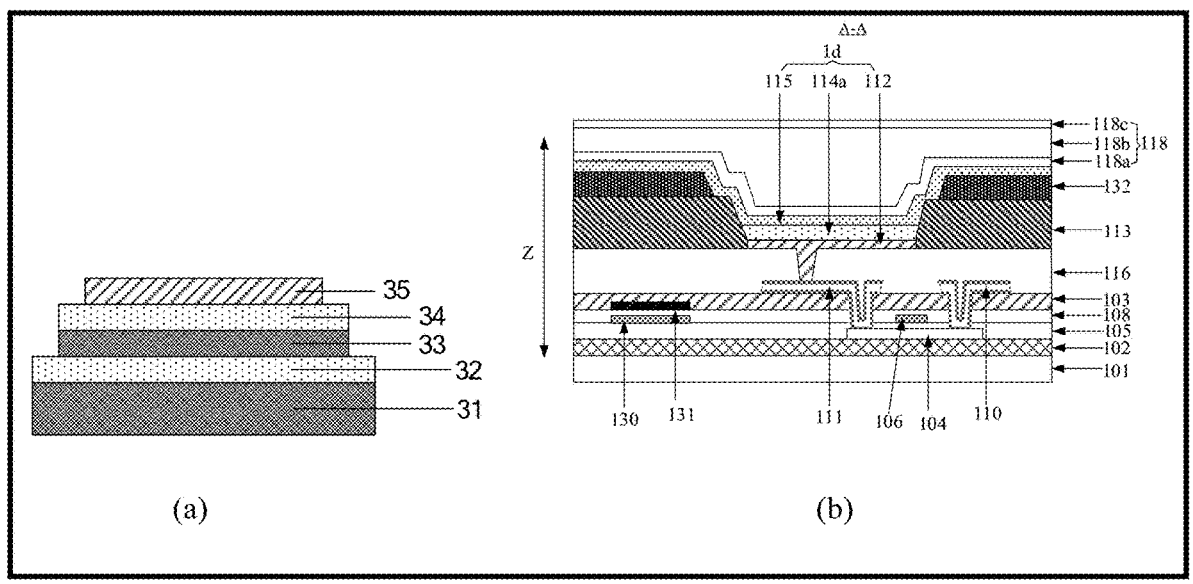
FIG. 3 shows in (a) a schematic diagram of a cross-sectional structure of a first barrier wall provided by an embodiment of the present disclosure, and shows in (b) a schematic diagram of a cross-sectional structure of a TFT in an effective display area, where some film layers in (b) are made of same materials as some film layers in (a).

In an implementation, referring to (a) in FIG. 3, the first barrier wall 22 may include a first gate metal layer 31, a first gate insulating layer 32, a second gate metal layer 33, a second gate insulating layer 34, and a source and drain metal layer 35 stacked in sequence. The first gate metal layer 31 is arranged closer to the substrate 21 than the first gate insulating layer. In other words, layers of the first barrier wall 22 may be manufactured in same layers and made of same materials as corresponding film layers of a thin film transistor, a capacitor structure, and a display element in the effective display area. It should be noted that the first barrier wall 22 is not limited to the layer structure shown in FIG. 3. Any convex structure including stacked metal layers and insulating layers may be used as the first barrier wall. The materials and structures of the first barrier wall are not specifically limited in this embodiment.

As shown in (b) in FIG. 3, the thin film transistor in the effective display area may be of a top gate type. The thin film transistor may include an active layer 104, a first gate insulating layer 105, a gate electrode 106, a second gate insulating layer 108, an interlayer dielectric layer 103, a source electrode 110, and a drain electrode 111. Specifically, the active layer 104 may be formed on a buffer layer 102. The first gate insulating layer 105 covers the buffer layer 102 and the active layer 104. The gate electrode 106 is formed on a side of the first gate insulating layer 105 away from the active layer 104. The second gate insulating layer 108 covers the gate electrode 106 and the first gate insulating layer 105. The interlayer dielectric layer 103 covers the second gate insulating layer 108. The source electrode 110 and the drain electrode 111 are formed on a side of the interlayer dielectric layer 103 away from the base substrate and located on opposite sides of the gate electrode 106. The source electrode 110 and the drain electrode 111 may contact opposite sides of the active layer 104, respectively, through via holes (for example, metal via holes). It should be understood that the thin film transistor may also be of a bottom gate type.

As shown in (b) in FIG. 3, the capacitor structure may include a first electrode plate 130 and a second electrode plate 131. The first electrode plate 130 is arranged in the same layer as the gate electrode 106. The second electrode plate 131 is located between the second gate insulating layer 108 and the interlayer dielectric layer 103, and arranged opposite to the first electrode plate 130.

For example, materials of the gate electrode 106, the first electrode plate 130, and the second electrode plate 131 may include metal materials or alloy materials, such as molybdenum, aluminum, and titanium. The source electrode 110 and the drain electrode 111 may include a metal material or an alloy material, such as a metal single-layer or multi-layer structure formed of molybdenum, aluminum, titanium, and so on. For example, the multi-layer structure is a multi-metal laminated layer, such as Al/Ti/Al laminated layer or the like.

As shown in (b) in FIG. 3, the display element is located in the display area. The display element may include a first electrode 112 and a pixel defining portion 113 sequentially formed on the interlayer dielectric layer 103. It should be understood that the display element may further include a light-emitting portion 114a and a second electrode 115.

In detail, when the thin film transistor in the display area is of the top gate type, a planarization layer may be formed before the display element is manufactured. The planarization layer may be a single-layer structure or a multi-layer structure. The planarization layer is generally made of an organic material, such as photoresist, acrylic-based polymer, silicon-based polymer and so on. As shown in FIG. 3, the planarization layer may include a planarization portion 116 located in a display area 10a. The planarization portion 116 is formed between the interlayer dielectric layer 103 and the first electrode 112. The first electrode 112 may be electrically connected to the drain electrode 111 through a metal via hole. The first electrode 112 may be an anode, which may be made of Indium Tin Oxide (ITO), Indium Zinc Oxide (IZO), Zinc Oxide (ZnO) or other materials. A pixel defining portion 113 may cover the planarization portion 116. The pixel defining portion 113 may be made of an organic material such as photoresist. A portion of the pixel defining portion 113 located in the display area 10a may have a pixel opening exposing the first electrode 112. A light-emitting portion 114a is located in the pixel opening and formed on the first electrode 112. The light-emitting portion 114a may include a small molecular organic material or a polymer molecular organic material, and may be a fluorescent light-emitting material or a phosphorescent light-emitting material, which may emit red light, green light, blue light, or white light. Moreover, according to different actual needs, in different examples, the light-emitting portion 114a may further include functional layers such as an electron injection layer, an electron transport layer, a hole injection layer, and a hole transport layer. The second electrode 115 covers the light-emitting portion 114a, and the second electrode 115 has a polarity opposite to that of the first electrode 112. The second electrode 115 may be a cathode, which may be made of metal materials such as lithium (Li), aluminum (Al), magnesium (Mg), silver (Ag), and so on.

It should be noted that, as shown in (b) in FIG. 3, the first electrode 112, the light-emitting portion 114a, and the second electrode 115 may constitute a light-emitting sub-pixel 1d. A portion of the display element located in the display area 10a may include a plurality of light-emitting sub-pixels 1d arranged in an array. In addition, it should be noted that the first electrodes 112 of the light-emitting sub-pixels 1d are independent of each other, and the second electrodes 115 of the light-emitting sub-pixels 1d are coupled to form a whole surface. That is, the second electrode 115 is a whole-surface structure provided on the display substrate 10, and is a common electrode for multiple display elements.

In some embodiments, as shown in (b) in FIG. 3, a supporting portion 132 may be provided on a side of the pixel defining portion 113 away from the interlayer dielectric layer 103. The supporting portion 132 may function to support a protective film layer (not shown), so as to prevent the protective film layer from contacting the first electrode 112 or other lines and prevent damage to the first electrode 112 or other lines. It should be noted that the protective film layer is mainly present during a transfer of a semi-finished product to avoid damage to the semi-finished product during the transfer. Specifically, in a process of transferring the substrate on which the supporting portion 132 has been manufactured to an evaporation production line, it may be covered with a protective film layer, and the protective film layer may be removed when the evaporation of a luminescent material is needed.

For example, a material of the supporting portion 132 may be the same as that of the pixel defining portion 113, and the supporting portion 132 and the pixel defining portion 113 may be formed by same patterning process, but it is not limited to this. A material of the supporting portion 132 may also be different from that of the pixel defining portion 113, and the supporting portion 132 and the pixel defining portion 113 may also be formed by different patterning processes.

In order to reduce a risk of generating cracks, referring to FIG. 2, a portion of the substrate 21 close to the punch area includes a base substrate 211 and an inorganic film layer 212 arranged on the base substrate 211. The inorganic film layer 212 has a thickness less than a preset threshold. A specific value of the preset threshold may be set according to actual conditions, which is not limited in this embodiment. In practical applications, inorganic material layers at a cutting edge of the base substrate 211 may be treated by an etching process (for example, the interlayer dielectric layer ILD, the gate insulating layer GI, and the buffer layer buffer may be etched away, and only a very thin layer of the second inorganic layer barrier2 is left), so that the inorganic film layer 212 at the cutting edge (a boundary between the punch area and the critical area) is thinned, thereby reducing the risk of generating cracks during a cutting process.

In order to prevent the organic layer material in the effective display area from flowing to the cutting edge, referring to FIG. 2, the critical area of the display substrate may further include: a second barrier wall 23 arranged on the substrate 21 and located between the first barrier wall 22 and the effective display area. The second barrier wall 23 includes a planarization layer, a first pixel defining layer, and a first supporting layer arranged in a stack. The planarization layer is closer to the substrate 21 than the first pixel defining layer. The second barrier wall has a height greater than that of the first barrier wall. The second barrier wall is a convex structure.

Further, the critical area of the display substrate may further include a third barrier wall 24 arranged on the substrate 21 and located between the second barrier wall 23 and the effective display area. The third barrier wall 24 includes a second pixel defining layer and a second supporting layer arranged in a stack. The second pixel defining layer is arranged closer to the substrate 21 than the second supporting layer. The third barrier wall is a convex structure. By providing the third barrier wall, the organic layer material in the effective display area may be further prevented from flowing to the cutting edge. The third barrier wall has a height greater than that of the first barrier wall and less than or equal to that of the second barrier wall. It should be noted that the heights of the first barrier wall, the second barrier wall, and the third barrier wall in the present disclosure all refer to the height of the convex structure. In FIG. 2, the height h1 of the first barrier wall 22, the height h2 of the second barrier wall 23, and the height h3 of the third barrier wall 24 are related as h1<h3≤h2.

It should be noted that the first barrier wall 22, the second barrier wall 23, and the third barrier wall 24 are separately arranged in the critical area in a ring shape.

The inventors also found that in a process of depositing the EL material, since the open mask may not cover the punch area, the EL material may be deposited on the cutting edge, which may cause water and oxygen to corrode along the EL material to the effective display area, and finally cause an encapsulation failure.

Figure 4:
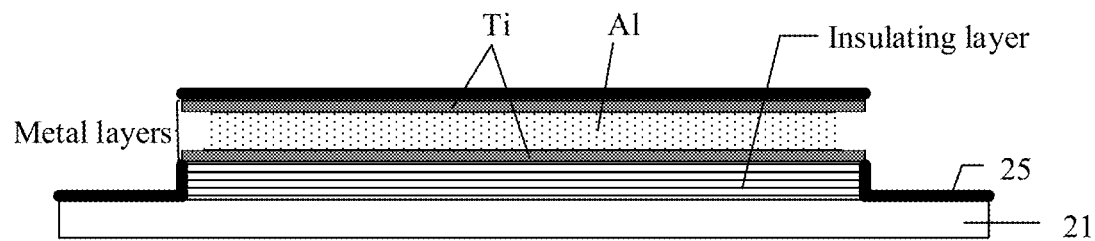
FIG. 4 shows a schematic diagram of a cross-sectional structure of metal layers in a first barrier wall provided by an embodiment of the present disclosure.

In order to solve this problem, referring to FIG. 4, the metal layer is disposed away from the substrate 21. Materials of the metal layer include a first titanium material layer, an aluminum material layer, and a second titanium material layer arranged in a stack. In practical applications, the metal layer may include a source and drain metal layer 35. Materials of the source and drain metal layer 35 may be a first titanium material layer, an aluminum material layer, and a second titanium material layer arranged in a stack. Edges of the aluminum material layer are indented relative to edges of the first titanium material layer and the second titanium material layer.

A first functional layer is further provided on the substrate and the first barrier wall. It is precisely because the first titanium material layer, the aluminum material layer, and the second titanium material layer form an I-shaped structure together, the source and drain metal layer may easily disconnect the first functional layer. The first functional layer may be a cathode of an organic light-emitting layer or a light-emitting device.

Referring to FIG. 2 and FIG. 4, take the first functional layer being an organic light-emitting layer as an example, the critical area of the display substrate may further include an organic light-emitting layer 25 arranged on the substrate 21 and the first barrier wall 22. The organic light-emitting layer 25 is disconnected by the metal layer (or the source and drain metal layer).

In practical applications, a wet etching process may be used. An etching solution etches edges of the aluminum material layer, so that the edges of the aluminum material layer are indented relative to the edges of the first titanium material layer and the second titanium material layer, thereby forming an I-shaped structure. In this way, the organic light-emitting layer 25 is disconnected at edges of the metal layer during a formation process, and the disconnected EL material blocks the water and oxygen propagation path, thus preventing water and oxygen from entering the effective display area, and finally meeting the reliability requirements.

Figure 5:
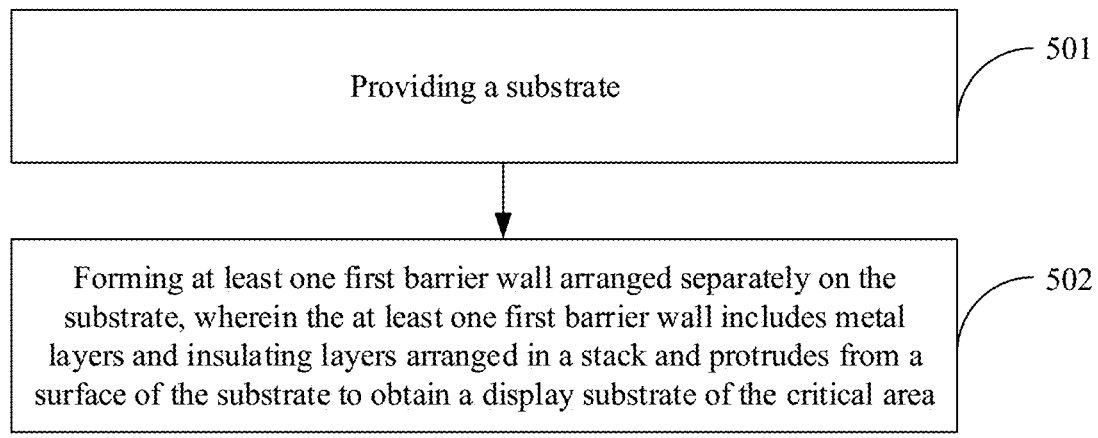
FIG. 5 shows a step flowchart of a method for manufacturing a display substrate provided by an embodiment of the present disclosure.

Another embodiment of the present disclosure provides a method for manufacturing a display substrate. The display substrate includes an effective display area, a punch area, and a critical area arranged between the effective display area and the punch area. Referring to FIG. 5, the manufacturing method includes: step 501 of providing a substrate; and step 502 of forming at least one first barrier wall on the substrate, at a position corresponding to the critical area, where the first barrier wall is a convex structure. FIG. 1 shows a schematic diagram of a plane structure of the display substrate manufactured according to an embodiment of the present disclosure. FIG. 2 shows a schematic diagram of a cross-sectional structure of the display substrate manufactured according to an embodiment of the present disclosure.

In an implementation, the step 502 of forming at least one first barrier wall on the substrate may include: forming a first gate metal layer, a first gate insulating layer, a second gate metal layer, a second gate insulating layer, and a source and drain metal layer in sequence on the substrate, to obtain the first barrier wall. FIG. 3 shows a schematic diagram of a cross-sectional structure of the first barrier wall manufactured according to an embodiment of the present disclosure.

In an implementation, the step 501 may include: providing a base substrate; forming an inorganic film material layer on the base substrate; and etching the inorganic film material layer to obtain an inorganic film layer.

The step 501 may further include etching the inorganic film material layer to obtain an inorganic film layer so that a portion of the inorganic film layer close to the punch area has a thickness less than that of the other portion of the inorganic film layer.

Specifically, a series of patterning processes such as an exposure, a development, and an etching may be used to sequentially etch the inorganic film material layers such as the interlayer dielectric layer ILD, the gate insulating layer GI, the buffer layer buffer, and the second inorganic layer barrier2, only leaving a very thin layer of the second inorganic layer barrier2, thereby achieving an effect of reducing a thickness of the inorganic layer and reducing the risk of generating cracks during the cutting process.

In order to prevent the organic layer material in the effective display area from flowing to the cutting edge, the manufacturing method provided in this embodiment may further include: forming a planarization layer, a first pixel defining layer, and a first supporting layer in sequence in an area between the first barrier wall and the effective display area on the substrate, so as to obtain a second barrier wall. The second barrier wall has a height greater than that of the first barrier wall.

In order to further prevent the organic layer material in the effective display area from flowing to the cutting edge, the manufacturing method provided in this embodiment may further include: forming a second pixel defining layer and a second supporting layer in sequence in an area between the second barrier wall and the effective display area on the substrate, so as to obtain a third barrier wall. The third barrier wall has a height greater than that of the first barrier wall and less than or equal to that of the second barrier wall.

In order to prevent water and oxygen from corroding along the EL material to the effective display area, the step 502 of forming the first barrier wall on the substrate may include: forming a metal layer on a side of the substrate, where the metal layer includes a first titanium material layer, an aluminum material layer, and a second titanium material layer arranged in a stack; and processing the metal layer by a wet etching process, so as to etch away the edges of the aluminum material layer.

Specifically, the display substrate on which the metal layer has been formed is put into an etching solution, and the etching solution reacts with the edges of the exposed aluminum metal layer to naturally form an indented "I-shaped structure". Referring to FIG. 4, the "I-shaped structure" causes subsequently formed EL layer to be disconnected here. The disconnected EL material blocks the propagation path of water and oxygen, which prevents water and oxygen from entering the effective display area, and finally meets the reliability requirements.

After the etching is completed, the manufacturing method provided in this embodiment may further include: forming a first functional layer (for example, an organic light-emitting layer) on the substrate and the first barrier wall, where the first functional layer is disconnected by the metal layer (specifically, a source and drain metal layer).

The structure and beneficial effects of the display substrate obtained by the manufacturing method provided in this embodiment may be referred to the description of the foregoing embodiments of the display substrate, which may not be repeated here.

Another embodiment of the present disclosure provides a display device including the display substrate described in any one of the embodiments.

It should be noted that the display device in this embodiment may be any product or component with a display function, such as a display panel, an electronic paper, a mobile phone, a tablet computer, a television, a notebook computer, a digital photo frame, a navigator, and the like.

The embodiments provide a display substrate, a method for manufacturing the display substrate, and a display device. The display substrate includes an effective display area, a punch area, and a critical area arranged between the effective display area and the punch area. The critical area of the display substrate includes: a substrate, and at least one first barrier wall arranged on the substrate. The first barrier walls are arranged separately, the first barrier wall includes stacked metal layers and insulating layers, and the first barrier wall protrudes from the surface of the substrate. By providing the first barrier walls protruding from the surface of the substrate in the critical area, the undulations formed by the first barrier walls on the surface of the substrate may block the propagation of the crack and block the extension of the crack to the effective display area, thereby improving the reliability of the display product.

The various embodiments in the specification are described in a progressive manner. Each embodiment focuses on the differences from other embodiments, and the same or similar parts between the various embodiments may be referred to each other.

Finally, it should be noted that in the present disclosure, relational terms such as first and second are only used to distinguish one entity or operation from another entity or operation, and do not necessarily require or imply that there is any such actual relationship or order between these entities or operations. Moreover, the terms "comprise", "include" or any other variants thereof are intended to cover non-exclusive inclusion, so that a process, a method, a product or an apparatus including a series of elements not only includes those elements, but also includes other elements not clearly listed of, or further includes elements inherent to this process, method, product or apparatus. If there are no more restrictions, the element defined by the sentence "including a . . . " does not exclude the existence of other identical elements in the process, method, product or apparatus that includes the element.

The method for manufacturing the display substrate, the display substrate and the display device provided by the present disclosure are described in detail above. Specific examples are used in the present disclosure to illustrate the principles and implementations of the present disclosure. The description of the above embodiments is only to help understand the method and core ideas of the present disclosure. Moreover, for those ordinary skilled in the art, there will be changes in the specific implementation and the scope of application according to the ideas of the present disclosure. In summary, the content of the specification should not be construed as limiting the present disclosure.

What is claimed is:

1. A display substrate, comprising an effective display area, a punch area, and a critical area between the effective display area and the punch area, wherein the critical area of the display substrate comprises:
   a substrate; and
   at least two first barrier walls on the substrate, wherein each of the at least two first barrier walls is a convex structure,
   wherein the each of the at least two first barrier walls comprises a first gate metal layer, a first gate insulating layer, a second gate metal layer, a second gate insulating layer, and a source and drain metal layer stacked in sequence, and wherein the first gate metal layer is closer to the substrate than the first gate insulating layer,
   wherein the critical area of the display substrate further comprises a first functional layer, the first functional layer comprises at least a first part on the substrate and a second part on each of the at least two first barrier walls, the second part of the first functional layer is located on a surface of the source and drain metal layer of each of the at least two first barrier walls on a side of the source and drain metal layer away from the substrate; and
   wherein the at least two first barrier walls are spaced apart from each other, and a recess portion is formed between adjacent two first barrier walls among the at least two first barrier walls, and at least part of the first part is located at the recess portion between the adjacent two first barrier walls and disconnected from the second parts on the adjacent two first barrier walls.

2. The display substrate according to claim 1, wherein the source and drain metal layer comprise a first titanium material layer, an aluminum material layer, and a second titanium material layer arranged in a stack.

3. The display substrate according to claim 2, wherein edges of the aluminum material layer are indented relative to edges of the first titanium material layer and the second titanium material layer.

4. The display substrate according to claim 1, wherein five to seven first barrier walls are provided on the substrate.

5. The display substrate according to claim 1, wherein the substrate comprises:
   a base substrate; and
   an inorganic film layer on the base substrate.

6. The display substrate according to claim 5, wherein a portion of the inorganic film layer close to the punch area has a thickness less than a thickness of the other portion of the inorganic film layer.

7. The display substrate according to claim 1, wherein the first functional layer is an organic light-emitting layer.

8. A display device, comprising a display substrate, wherein the display substrate comprises:
   an effective display area, a punch area, and a critical area between the effective display area and the punch area, and the critical area of the display substrate comprises:
   a substrate; and
   at least two first barrier wall on the substrate, wherein each of the at least two first barrier walls is a convex structure,
   wherein each of the at least two first barrier walls comprises a first gate metal layer, a first gate insulating layer, a second gate metal layer, a second gate insulating layer, and a source and drain metal layer stacked in sequence, and wherein the first gate metal layer is closer to the substrate than the first gate insulating layer,
   wherein the critical area of the display substrate further comprises a first functional layer, the first functional layer comprises at least a first part on the substrate and a second part on each of the at least two first barrier walls, the second part of the first functional layer is located on a surface of the source and drain metal layer of each of the at least two first barrier walls the first barrier wall on a side of the source and drain metal layer away from the substrate; and
   wherein the at least two first barrier walls are spaced apart from each other, and a recess portion is formed between adjacent two first barrier walls among the at least two first barrier walls, and at least part of the first part is located at the recess portion between the adjacent two first barrier walls and disconnected from the second parts on the adjacent two first barrier walls.

\* \* \* \* \*